United States Patent [19]

Suwa et al.

[11] Patent Number: 4,741,622
[45] Date of Patent: May 3, 1988

[54] METHOD AND APPARATUS FOR DETECTING DIVERSION

[75] Inventors: Kyoichi Suwa, Yokohama; Masaichi Murakami, Tokyo, both of Japan

[73] Assignee: Nippon Kogaku K.K., Tokyo, Japan

[21] Appl. No.: 835,526

[22] Filed: Mar. 3, 1986

[30] Foreign Application Priority Data

Mar. 4, 1985 [JP]  Japan .................................. 60-41187

[51] Int. Cl.$^4$ ............................................. G01B 11/27
[52] U.S. Cl. .................................... 356/401; 356/372; 356/389; 356/397
[58] Field of Search ............... 356/372, 394, 389, 401, 356/397

[56] References Cited

U.S. PATENT DOCUMENTS 4,640,619  2/1987  Edmark ................................. 356/372

Primary Examiner—R. A. Rosenberger
Attorney, Agent, or Firm—Michael N. Meller

[57] ABSTRACT

A method of detecting a registration diversion between a mask and a wafer prior to a main exposure. This method detects relative diversions between marks on the wafer and latent images of marks on the mask formed on a photosensitive layer of the wafer. The latent images of the marks on the mask are preliminarily formed on the photosensitive layer of the wafer by an exposure energy beam prior to the main exposure.

20 Claims, 6 Drawing Sheets

METHOD AND APPARATUS FOR DETECTING DIVERSION

BACKGROUND OF THE INVENTION

1. Technical Field of the Invention

The present invention relates to a diversion detection which not only detects a registration diversion between a reticle (a magnified mask) or a full-size mask (hereinafter referred to as a reticle) and a wafer prior to a main exposure but also detects a lithographic magnification error.

2. Description of the Prior Art

Recently, reduction projection exposure apparatus have been used as apparatus for the lithography of microscopic circuit patterns in the manufacture of semiconductor devices such as ICs and LSIs. This reduction projection exposure apparatus is designed so that the circuit pattern formed on a reticle is exposed and printed in a reduced form in the photoresist (photosensitive material) formed on the wafer through a projection lens. While the projection lens has a resolution on the order of 1 micron, even if a projection lens of such high resolution is used, there are cases where a diversion is caused and satisfactory accuracy is not obtained in the registration exposure of the circuit pattern (chip) already formed on the wafer and a projected image of the circuit pattern on the reticle. It is considered that the causes of this diversion include relative run-outs of the circuit pattern (chip) on the wafer and the projected image of the circuit pattern on the reticle due to a run-out of the wafer caused by the processing of the wafer (a process such as etching or diffusion), variations in the reduction magnification of the projection lens itself, a registration diversion between the wafer and the reticle and the like. In the past, the detection of a registration diversion between a wafer and a reticle has been effected by measuring with given measuring means the circuit pattern formed on the wafer through its exposure and development. However, there has been a disadvantage that even if a diversion occurs during the registration exposure, not only it is impossible to quantitatively detect the diversion but also even detection of the occurrence of the diversion is not possible.

Also, there has been a problem that the detection of a registration diversion between a wafer and a reticle is effected by forming reference patterns (e.g., vernier marks) of a test reticle on the wafer and measuring them with given measuring means, thus requiring much time and labor.

SUMMARY OF THE INVENTION

The present invention has been made in view of these circumstances and it is an object of the invention to provide a method and apparatus for detecting any diversion that may be caused during a registration exposure, an overall lithographic magnification, etc., without developing the photo-sensitive substrate.

Thus, the present invention comprises aligning a substrate to be exposed having first patterns formed at given positions and a photosensitive layer formed on the surface and a mask having second patterns in such a manner that given positional relations are established between the first and second patterns, projecting an exposure energy beam onto the substrate to be exposed through the mask to form latent images of the second patterns on the photosensitive layer, photoelectrically detecting the latent images by utilizing the fact that the exposed portions subjected to the projection of the energy beam for the latent images and the unexposed portion not subjected to the projection differ in optical characteristics from each other, photoelectrically detecting the first patterns and detecting positional relations between the first patterns and the latent images, thereby detecting a diversion between the substrate to be exposed and the mask without developing the substrate to be exposed.

DESCRIPTION OF THE PREFERRED EMBODIMENTS

An embodiment of the invention will now be described in detail with reference to the accompanying drawings.

Figure 1:
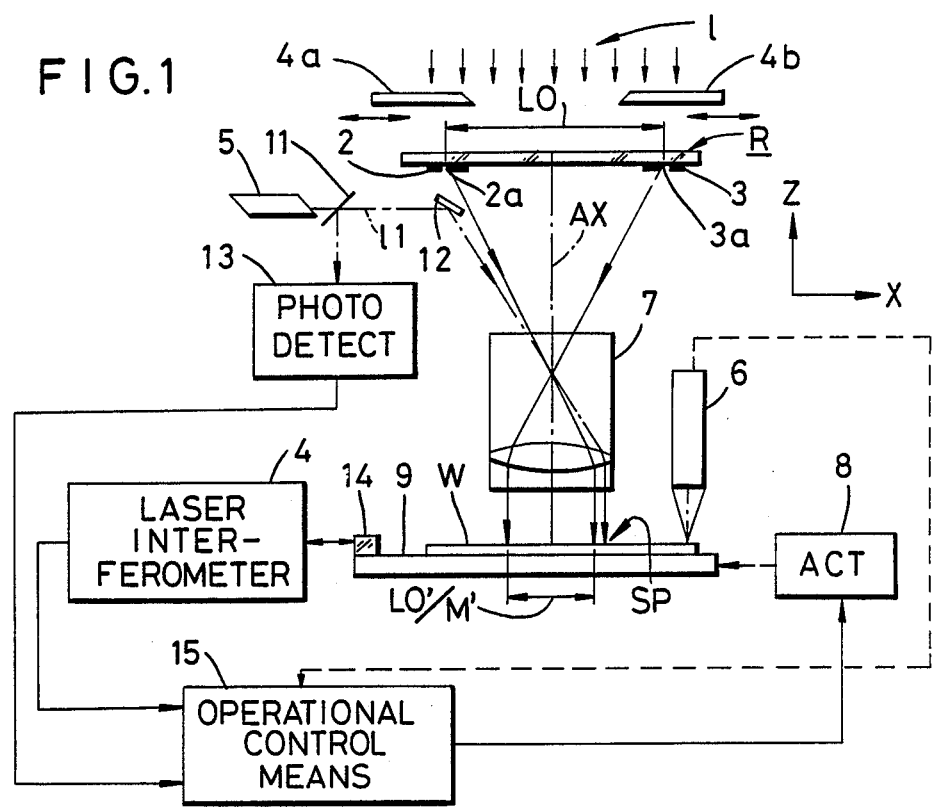
FIG. 1 is a schematic diagram of a reduction projection exposure apparatus to which is applied a diversion detecting method according to the invention.

FIG. 1 is a schematic diagram of a reduction projection exposure apparatus according to the invention. In FIG. 1, an exposure light 1 is of a wavelength effective in sensitizing a photoresist (e.g., g-line or i-line) and it is projected to a reticle R (mask) through reticle blinds 4a and 4b which are slidable in an X-direction so that the circuit pattern formed on the reticle R is imaged on a wafer W (substrate to be exposed) having formed thereon a photoresist layer (photosensitive layer) through a projection lens 7 having a design reduction magnification of 1/M (where M is 1 or greater).

A light source 5 emits a laser beam 11 (helium-neon) having a wavelength which does not sensitize the photoresist. The laser beam L1 is transmitted through a beam splitter 11, bent by a mirror 12 toward the center of the entrance pupil of the projection lens 7 and imaged as a beam spot SP on the wafer W through the projection lens 7. When the laser beam 11 incident to the wafer W illuminates a mark on the wafer W (e.g., the stepped edges of the irregularities), it is diffracted or scattered so that the diffracted light or the scattered light falls back on the projection lens 7 and it is then projected to a photo-detector 13 for detecting the diffracted or scattered light through the mirror 12 and the beam splitter 11. The light source 5, the beam splitter 11, the mirror 12 and the photodetector 13 form an alignment optical system of the through-the lens (TTL) type which aligns the wafer W through the use of the projection lens 7. It is to be noted that the photodetector 13 also includes a photoelectric element for receiving the amount of the regular reflected light in addition to the detection of the diffracted or scattered light and the diffracted or scattered light and the regular reflected light are suitably separated and taken out by a spacial filter.

An off-axis microscope 6 is one known as a so-called laser scan (oscillation) type photoelectric microscope so that it has an optical axis parallel to the optical axis AX of the projection lens 7 and it is disposed at a predetermined distance from the projection lens 7. This off-axis microscope 6 is essentially used for the purpose of detecting the alignment marks on the wafer W and aligning the wafer W with the projection lens 7. In other words, the off-axis microscope 6 effects the alignment by converging a laser beam (helium-neon) of a wavelength which does not sensitize the photoresist into a spot of beam, causing the spot to make small oscillations on the wafer W, photoelectrically detecting the scattered or diffracted light from the stepped edges of the irregularities on the wafer W and subjecting the resulting photo-electric signal to synchronous detection. In this case, it is assumed that the beam spot SP from the TTL type alignment optical system and the beam spot from the off-axis microscope 6 are each shaped as an elongated ellipse (slit-like shape) in the X direction or the Y direction (the direction vertical to the plane of the drawing through a cylindrical lens which is not shown.

A stage 9 having the wafer W loaded thereon is movable two-dimensionally in the X and Y directions, thereby altering the position of the wafer W as desired. An actuator 8 moves the stage 9 in the X direction and also a laser interferometer 4 projects a measuring laser beam vertically to the reflecting plane of a movable mirror 14 fixedly mounted on the stage 9, thereby detecting the X-direction position of the stage 9 and generating a position signal corresponding to the detected position. It is assumed that there are similarly provided an actuator for moving the stage 9 in the Y direction and a laser interferometer for detecting the Y-direction position of the stage 9 (which are not shown).

Operational control means 15 is responsive to the photo-electric signal from the photodetector 13 and the position signal from the laser interferometer 4 to compute a registration diversion (including an overall lithographical magnification error) between the reticle R and the wafer W and also to control the actuator 8, thereby effecting the positioning of the stage 9.

Figure 2A:
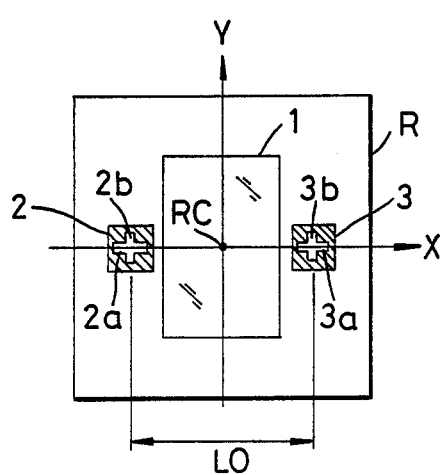
FIGS. 2A and 2B are plan views of reticles used in the apparatus of FIG. 1.
Figure 2B:
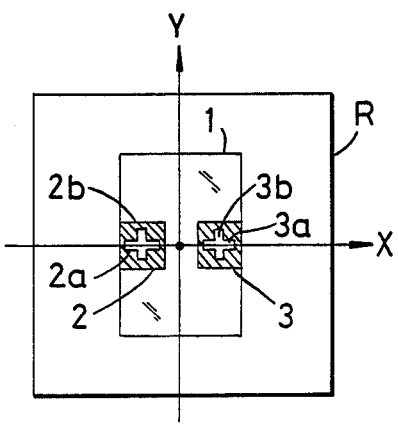

FIG. 2 shows examples of the reticle R used in the above-mentioned reduction projection exposure apparatus. The reticle R shown in FIG. 2A includes a pattern area 1 having a given circuit pattern formed with a light shielding material such as chrome on a glass substrate and provided on both sides of the pattern area 1 are light shielding portions 2 and 3 (second patterns) of rectangular shape which are made of chrome or the like and arranged at equidistant positions from the center RC of the pattern area 1 with a center distance $L_o$. Also, if an XY rectangular coordinate system is established with the origin being the center of the pattern area 1 and the X axis passing through the centers of the light shielding portions 2 and 3, of slit-like apertures (marks) 2a and 2b and apertures (marks) 3a and 3b which are respectively formed in the light shielding portions 2 and 3, the apertures 2a and 3a are positioned on the X axis and the apertures 2b and 3b are each positioned on a straight line parallel to the Y axis. FIG. 2B shows another example of the reticle R in which the light shielding portions 2 and 3 are provided within the pattern area 1.

Figure 3:
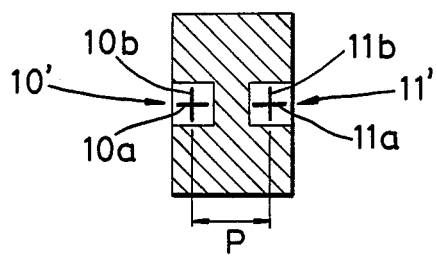
FIG. 3 is a plan view of one of the chips on a wafer used in the apparatus of FIG. 1, FIGS. 4 and 8 show latent images formed by the apparatus of FIG. 1.

FIG. 3 shows the circuit pattern formed on the wafer W used in the previously described reduction projection exposure apparatus. Formed with a center distance P in the chip are a cross alignment mark 10' (a first pattern) consisting of linear marks 10a and 10b crossing at right angles in the X and Y directions, respectively, and a cross alignment mark 11' (a first pattern) consisting of linear marks 11a and 11b crossing at right angles in the X and Y directions, respectively. If an XY rectangular coordinate system is established with the center of the chip as its origin in the like manner with those shown in FIGS. 2A and 2B, of the alignment marks 10' and 11' the alignment marks 10a and 11a are positioned on the X axis and the alignment marks 10b and 11b are each positioned on a straight line parallel to the Y axis.

It is to be noted that the reason for arranging the pair of alignment marks on the X axis of the XY coordinate system in FIGS. 2A, 2B and 3 is that the center of the X-direction measuring beam of the laser interferometer for measuring the position of the stage 9 is selected to coincide with the X axis. Thus, there is an advantage that no Abbe error will be included in the measurement of the X-direction position of each alignment mark.

Next, a description will be made of a method of detecting a registration diversion between the reticle R and the wafer W and a lithographic magnification error by the use of the reduction projection exposure apparatus shown in FIG. 1. Here, it is to be assumed that the lithographic magnification error includes not only a magnification error of the projection lens 7 itself but also a change in the size of the chip on the wafer W due to a run-out of the wafer W during the manufacturing processes of the ICs or LSIs.

A method of detecting a magnification error of the projection lens 7 itself will now be described first. According to this method, the surface of the wafer W is first coated with a photoresist to a uniform thickness of about 0.5 to 2 μm and the wafer W coated with the photoresist layer (photosensitive material layer) is loaded on the stage 9.

Then, with the reticle blind 4a being retracted from above the light shielding portion 2 of the reticle R, the pattern area 1, and the light shielding portion 3 of the reticle R are shielded by the reticle blind 4b and the reticle R is illuminated with the exposure light 1 thus forming latent images corresponding to the apertures 2a and 2b of the light shielding portion 2 on the photoresist layer of the wafer W. It is to be noted that during the formation of these latent images, although it varies depending on the thickness of the photoresist, the exposure light is projected to the photoresist layer in an amount corresponding to the saturation energy of the photoresist. The reason for this is that the differences in optical characteristics, such as the reflectance and refractive index, between the portions of the photoresist layer where the latent images are formed and their surrounding portion are increased as far as possible so as to facilitate the detection of the latent images which will be described later.

Then, the stage 9 is moved in the X direction by $L_o/M + a_X$ and in the Y direction by $a_Y$ by means of the actuator 8 and the laser interferometer 4. Here, if M' represents the actual reduction magnification of the projection lens 7, the values of $a_X$ and $a_Y$ respectively satisfy the relations $L_o/M > a_X > L_o|1/M - 1/M'|$ and $L_o/M > a_Y > L_o|1/M - 1/M'|$. After the stage 9 has been moved, the pattern area 1 and the light shielding portion 2 are shielded by the reticle blind 4a and the reticle blind 4b is retracted from above the light shielding portion 3, thus projecting the exposure light quantity corresponding to the saturation energy of the photoresist as during the formation of the latent images of the apertures 2a and 2b and thereby forming latent images corresponding to the apertures 3a and 3b of the light shielding portion 3 on the photoresist layer.

Figure 4:
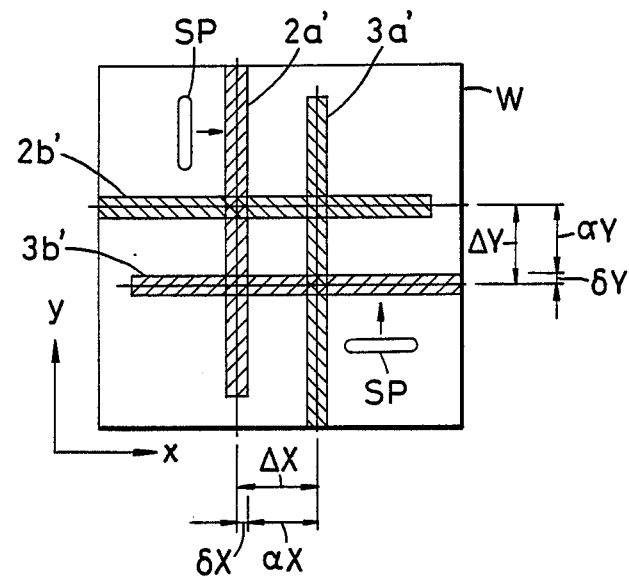

FIG. 4 shows the latent images 2a', 2b', 3a' and 3b' corresponding respectively to the apertures 2a, 2b, 3a and 3b and formed on the photoresist layer of the wafer W. As shown in FIG. 4, the center distance between the latent images 2a' and 3a' becomes $\Delta X$ and the center distance between the latent images 2b' and 3b' becomes $\Delta Y$.

Then, the distance $\Delta X$ between the latent images 2a' and 3a' becomes $L_o/M$ if there is no change in the X-direction reduction magnification of the production lens 7. However, if the actual reduction magnification becomes 1/M' (where M' is 1 or greater) due to the surrounding environment or the projection of the exposure light 1, the distance $\Delta X$ becomes a length $L_o/M'$ or the sum of the offset amount $aX$ and an X-direction magnification error $\delta X$ of the projection lens 7. Similarly, the distance $\Delta Y$ between the latent images 2b' and 3b' becomes a length representing the sum of the offset amount $aY$ and the Y-direction magnification error $\delta Y$ of the projection lens 7.

Then, the beam spot SP of the laser beam 11 by the previously mentioned TTL type alignment optical system is positioned parallel to the left side of the latent image 2a'. Then, the stage 9 is moved causing the beam spot SP to make a relative scanning in the X direction so that the laser beam 11 reflected from the photoresist layer is projected through the projection lens 7, the mirror 12 and the beam splitter 11 to the photodetector 13, thereby generating a photoelectric signal $I_s$. Also, during the spot scanning by the beam spot SP, the position of the stage 9, that is, the position of the beam spot SP, is detected by the laser interferometer 4, thereby generating a position signal $X_s$ indicative of the position of the beam spot SP.

Figure 5:
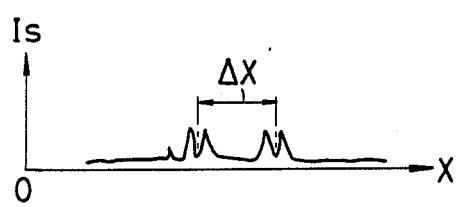
FIG. 5 is a waveform diagram of a photoelectric signal corresponding to the latent images of FIG. 4.

FIG. 5 is a diagram showing the waveform of the photoelectric signal $I_s$ resulting from the spot scanning by the beam spot SP. With the waveform of the photoelectric signal $I_s$, the exposed portions or the portions corresponding to the latent images 2a' and 3a' and the unexposed portions differ in waveform due to the production of the scattering or diffraction of the laser beam 11 by the exposed portions. Therefore, the operational control means 15 calculates the actual distance $\Delta X$ between the latent images 2a' and 3a' from the photoelectric signal $I_s$ and also performs the calculation of $\Delta X - aX$, thus determining an X-direction magnification error $\delta X$ of the projection lens 7. In the like manner, the operational control means 15 calculates a Y-direction magnification error $\delta Y$ of the projection lens 7 by calculating the distance $\Delta Y$ between the latent images 2b' and 3b' in accordance with the photoelectric signal $I_s$ obtained by the relative scanning of the beam spot SP in the Y direction and the position signal $Y_s$ detected by the laser interferometer 4 and performing the calculation of $\Delta Y - aY$.

It is to be noted that the latent images 2a', 2b', 3a' and 3b' can be detected by the off-axis microscope 6 in addition to the alignment optical system of the TTL type. However, since the off-axis microscope 6 is a laser oscillation-type photoelectric microscope, if it is desired to obtain a photoelectric signal $I_s$ as shown in FIG. 5, it is necessary to effect a synchronous detection at a frequency which is two times the oscillation frequency of the laser beam. If the synchronous detection is effected at the oscillation frequency of the laser beam, an S curve signal is obtained which becomes zero at the peak of the photo-electric signal $I_s$ and the zero point of the S curve signal corresponds to the edges of the latent images 2a', 2b', 3a' and 3b'. Where the reticle-wafer alignment is made in accordance with the detection by the off-axis microscope 6, it is necessary to preliminarily determine the accurate positional relation of the off-axis microscope 6 with the projection lens 7. This positional relation can also be determined by the same method as in the case of the previously mentioned detection by the alignment optical system.

Figure 6:
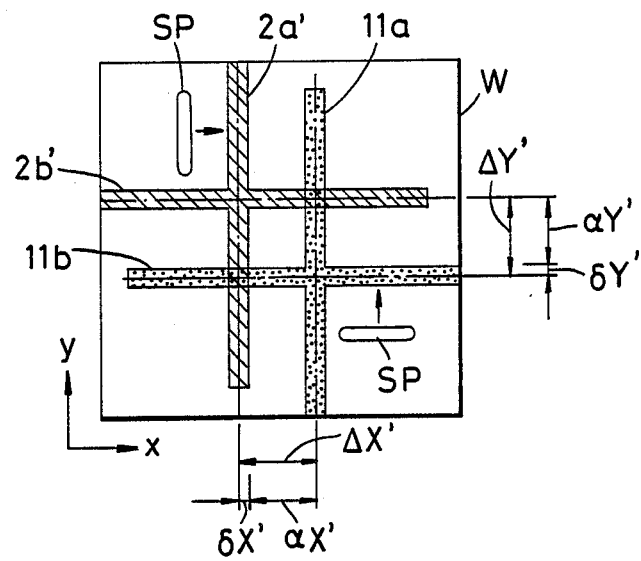
FIG. 6 is a diagram showing the alignment marks on a wafer and the latent images formed by the apparatus of FIG. 1.

Next, a method of detecting a registration diversion between the reticle R and the wafer W in accordance with the embodiment of the invention will be described. Using the same method as the previously mentioned formation of latent images, a photoresist layer is first formed on the wafer W having a chip such as shown in FIG. 3 and latent images 2a' and 2b' respectively corresponding to the apertures 2a and 2b of the light shielding portion 2 in the reticle R are formed as shown in FIG. 6. In this case, they are formed so that the center distance between the latent image 2a' and the alignment mark 11a preliminarily formed on the wafer W as shown in FIG. 3 becomes $\Delta X'$ and the distance between the latent image 2b' and the alignment mark 11b becomes $\Delta Y'$. The distance $\Delta X'$ includes an X-direction registration diversion $\delta X'$ between the reticle R and the wafer W in addition to the offset amount $aX'$ of the wafer W and the distance $\Delta Y'$ includes a Y-direction registration diversion $\delta Y'$ between the reticle R and the wafer W in addition to the offset amount $aY'$ of the wafer W.

Then, a relative scanning in the X direction is effected by using the beam spot SP from the previously mentioned alignment optical system, thereby generating a position signal $X_s$ of the beam spot SP and a photoelectric signal $I_s$.

Figure 7:
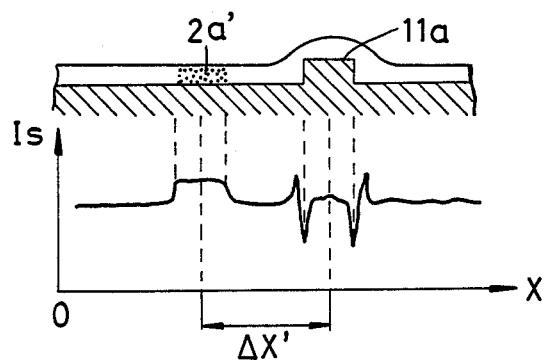
FIG. 7 is a diagram showing a waveform of the photoelectric signal corresponding to the alignment marks and the latent images in FIG. 6.

FIG. 7 is a waveform diagram of the photoelectric signal $I_s$ obtained as a result of the relative scanning by the beam spot SP. FIG. 7 shows the photoelectric signal waveform by the regular reflected light. As shown in FIG. 7, the waveform of the photoelectric signal $I_s$ differs between the portion where the latent image 2a' is formed, i.e., the exposed portion, and the unexposed portion. In other words, the portion of the latent image 2a' absorbs the exposure light energy up to the saturation and thus it is high in reflectance as compared with the unexposed portion. Also, the waveform of the photoelectric signal $I_s$ differs between the portion of the unexposed portion containing the alignment mark 11a and the remainder of the unexposed portion. In other words, the reflected light is reduced by scattering at both edges of the mark 11a. Thus, in accordance with the photoelectric signal $I_s$ and the position signal $X_s$, the operational control means 15 determines the actual distance $\Delta X'$ between the latent image $2a'$ and the alignment mark $11a$ and it also performs the calculation of $\Delta X' - \alpha X'$, thereby determining an X-direction registration diversion $\delta X'$ between the reticle R and the wafer W. Similarly, in accordance with a photoelectric signal $I_s$ obtained as the result of a relative scanning by the beam spot SP and a position signal $Y_s$ detected by the laser interferometer 4, the operational control means 15 determines the actual distance $\Delta Y'$ between the latent image $2b'$ and the alignment mark $11b$ and it also performs the calculation of $\Delta Y' - \alpha Y'$ thereby determining a Y-direction registration diversion $\delta Y'$ between the reticle R and the wafer W.

After the registration diversion between the reticle R and the wafer W has been determined, the stage 9 is moved in the X direction by $L_o/M - P + \delta X'$ and in the Y direction by $\delta Y''$ by means of the actuator 8 and the laser interferometer 4. Then, latent images $3a'$ and $3b'$ respectively corresponding to the apertures $3a$ and $3b$ are formed by the exposure light 1 at positions which are respectively apart from the center of the alignment mark $10'$ by $\alpha X'$ in the X direction and by $\alpha Y'$ in the Y direction. In this case, the center distance between the latent image $3a'$ and the alignment mark $10a$ becomes $\Delta X''$ and the center distance between the latent iamge $3b'$ and the alignment mark $10b$ becomes $\Delta Y''$. Since these distances $\Delta X''$ and $\Delta Y''$ respectively include, in addition to the offset amounts $\alpha X'$ and $\alpha Y'$, chip size variations $\delta X''$ and $\delta Y''$ due to the run-out of the wafer caused during the IC or LSI manufacturing processes, variations $\alpha X''$ and $\delta Y''$ are determined by the above-mentioned method, thereby determining variation of the chip size as an apparent magnification variation. In other words, an overall lithographic magnification error caused by the registration of the projected image of the pattern on the reticle R and the chip on the wafer W is determined.

It is to be noted that since, in this embodiment, the latent images $2a'$, $2b'$, $3a'$ $3b'$ and the alignment marks $10'$ and $11'$ are detected by means of the laser beam 11 which does not sensitize the photoresist, it is possible to enhance the detection accuracy by detecting the positions of such latent images or the alignment marks a number of times and obtaining the averages of the detected positions.

Figure 8:
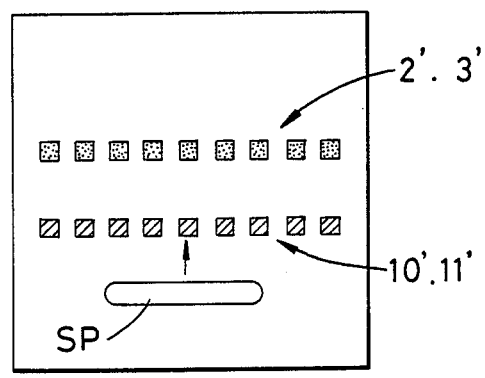

Also, the latent images $2'$ and $3'$ or the alignment marks $10'$ and $11'$ may each be formed as a diffraction grating as shown in FIG. 8 so as to detect the light diffracted in a direction perpendicular to the scanning direction of the beam spot SP or any specified direction.

Figure 9:
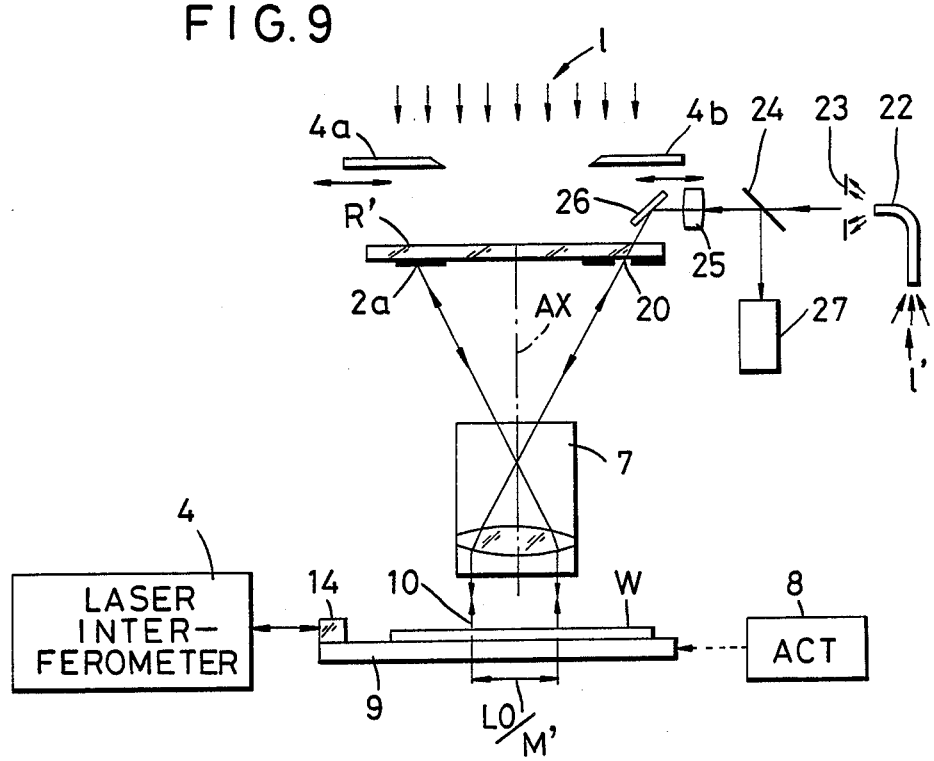
FIG. 9 is a schematic diagram of a reduction projection-type exposure apparatus according to another embodiment to which is applied the diversion detecting method according to the invention.

Referring now to FIG. 9, there is illustrated a schematic diagram of a reduction projection exposure apparatus in accordance with another embodiment. Note that in FIG. 9, the component parts performing the same functions as in FIG. 1 are designated by the same reference numerals and their explanation is omitted.

While, in the above-described embodiment, the TTL type alignment optical system employs the laser beam of a wavelength which does not sensitize the photoresist, this embodiment employs an illuminating light $1'$ of the same wavelength as the exposure light 1 for latent image forming purposes, that is, the illuminating light $1'$ of a wavelength which can sensitize the photoresist.

The illuminating light $1'$ having the same wavelength as the exposure light 1 and emitted from a light source which is not shown, is directed through a light guide 22 to a field stop 23, which in turn reshapes it in conformity with the shape of a window 20 formed in a reticle $R'$ (to will be described later), passed through a beam splitter 24 and an objective lens 25, caused to change its direction of travel by a mirror 26 and then imaged on the wafer W through the window 20 of the reticle $R'$ and the projection lens 7. The illuminating light $1'$ incident to the wafer W is reflected by the wafer W, directed back to the projection lens 7 and then projected to image pickup means 27 through the mirror 26, the objective lens 25 and the beam splitter 24. The light guide 22, the field stop 23, the beam splitter 24, the objective lens 25, the mirror 26 and the image pickup means 27 form a TTL type alignment optical system for observing both the patterns on the reticle $R'$ and the patterns on the wafer W by the use of the projection lens 7.

Figure 10:
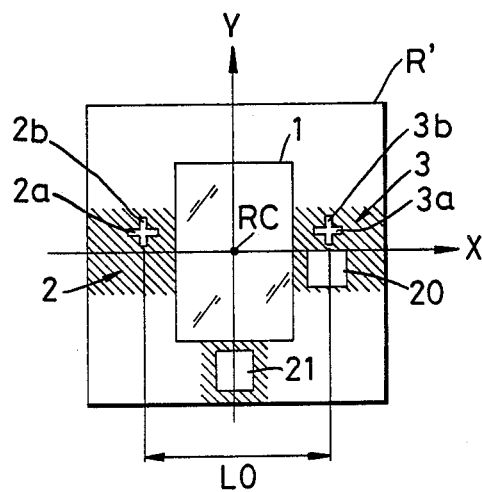
FIG. 10 is a plan view of a reticle used in the apparatus of FIG. 9.

FIG. 10 shows the reticle $R'$ used in the above-mentioned reduction projection exposure apparatus. While the apertures $2a$, $2b$ and $3a$, $3b$ respectively formed in the light shielding portions 2 and 3 on the sides of the pattern area 1 of the reticle $R'$ are cross-shaped as were their counterparts shown in FIG. 2A, they are slightly displaced in the Y direction from the X axis. The rectangular windows 20 and 21 respectively formed at the right and lower ends of the reticle $R'$ are provided for the purposes of observing the latent images formed on the wafer W in correspondence to the apertures $2a$, $2b$, $3a$ and $3b$ and the alignment marks on the wafer W through the projection lens 7. Note that the cross-shaped apertures $2a$, $2b$, $3a$ and $3b$ and the window 20 may be arranged on the X axis. In this case, by arranging so that the apertures $3a$ and $3b$ and the window 20 can be observed by the TTL type alignment optical system simultaneously or through its forward and backward movements, it is possible to prevent any Abbe error as in the case of the first embodiment.

Next, a method of detecting a magnification error of the projection lens 7 and a method of detecting a registration diversion between the reticle $R'$ and the wafer W by the use of the reduction projection exposure apparatus shown in FIG. 9 will be described.

Figure 11:
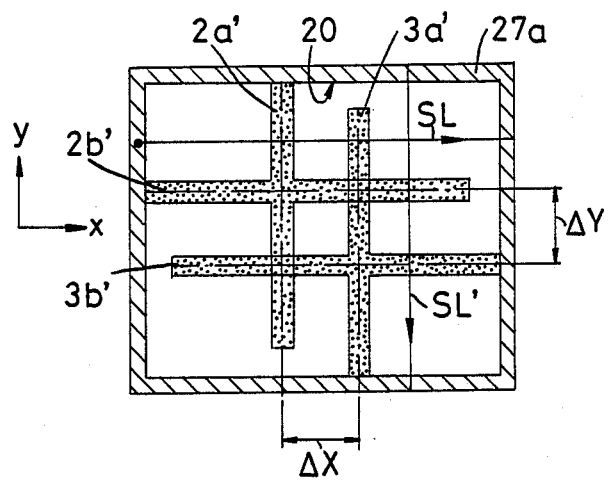
FIG. 11 is a diagram showing the latent images formed by the apparatus of FIG. 9.

The method of detecting a magnification error of the projection lens 7 itself will be described first. Firstly, in accordance with the same method as used with the apparatus shown in FIG. 1, latent images $2a'$, $2b'$, $3a'$ and $3b'$ respectively corresponding to the apertures $2a$, $2b$, $3a$ and $3b$ of the reticle $R'$ are formed as shown in FIG. 11. In this case, it is so designed that the center distance between the latent images $2a'$ and $3a'$ and the center distance between the latent images $2b'$ and $3b'$ become $\Delta X$ and $\Delta Y$, respectively. Note that since the apparatus shown in FIG. 9 includes the TTL type alignment optical system employing the illuminating light $1'$ of the same wavelength as the exposure light 1, these latent images may be formed by the illuminating light $1'$. In the case, two optical systems for illuminating the apertures $2a$ and $2b$ and the apertures $3a$ and $3b$, respectively, are necessary.

Then, the illuminating light $1'$ from the alignment optical system of the TTL type is projected onto the wafer W so that the regular reflected light from the wafer W is received by the image pickup means 27 and its photosensitive surface $27a$ is photoelectrically scanned in the X direction, thus generating an image signal IP corresponding to the resulting scanning line SL.

Where the thickness of the photoresist is selected to be 1 μm and its exposure light saturation energy (sensitivity) is selected to be 90 mJ/cm$^2$, if the illuminance of the latent image forming exposure light 1 on the wafer W is 300 mw/cm$^2$, then the time required for projecting to the photoresist the amount of exposure light corresponding to the saturation energy of the photoresist is 0.3 second (90/300). On the other hand, if the illuminance of the illuminating light 1' for producing the image signal IP is set to 30 mw/cm$^2$, the time required for saturating the photoresist is 3 seconds (90/30). As a result, if the image pickup means 27 is operated at the same scanning speed as a television camera or the like so as to generate an image signal IP corresponding to a scanning line SL in about 1/30 second even if the unexposed area of the photoresist is sensitized by the projection of the illuminating light 1', the resulting image signal IP has a satisfactorily distinguishable contrast between the latent images 2a' and 3a' or the exposed portions by the exposure light 1 and the unexposed portions.

In accordance with the same method as used with the apparatus shown in FIG. 1, an X-direction magnification error of the projection lens 7 can be detected on the basis of the image signal IP obtained in the above-mentioned manner.

Also, a Y-direction magnification error of the projection lens 7 can be easily detected by detecting the picture elements corresponding to a virtual scanning line SL parallel to the latent image 3a' from the image signal IP produced by the image pickup means 27 and arranging the picture elements in time sequence to obtain an image signal similar to the image signal IP of the scanning line SL and its description will be omitted. Also, since the image pickup means of the alignment optical system arranged above the window 21 of the reticle R' has a scanning line in a direction perpendicular to the scanning line SL of the image pickup means for observing the window 20, a Y-direction image signal may be obtained by aligning the wafer W in such a manner that the pair of latent images are observed through the window 21. While, in this embodiment, the illuminance of the illuminating light 1' is selected to be lower than that of the exposure light 1, the illuminance of the illuminating light 1' may be selected to be the same or higher than that of the exposure light 1 depending on the sensitivity of the photo-resist. In this case, however, a high-speed image processing circuit is provided so that the extraction (data sampling) of the image signal IP from the image pick-up means 27 is completed in a very short period of time, e.g., several milliseconds, after the beginning of the illumination by the illuminating light 1'.

Figure 12:
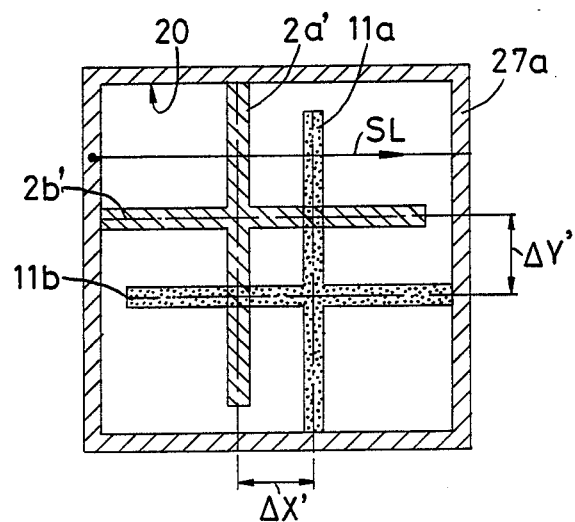
FIG. 12 is a diagram showing the alignment marks on a wafer and the latent images formed on the wafer by the apparatus of FIG. 9, and FIGS. 13, 14A and 14B are diagrams showing waveforms of the photoelectric signal and the image signals of FIG. 6.

Next, a description will be made of the method of detecting a registration diversion between the reticle R and the wafer W in accordance with the second embodiment of the invention. Firstly, in accordance with the same method used with the apparatus shown in FIG. 1, latent images 2a' and 2b' respectively corresponding to the apertures 2a and 2b of the reticle R' are formed on the wafer W having the alignment marks 11a and 11b as shown in FIG. 12. In this case, it is so arranged that the center distance between the latent image 2a' and the alignment mark 11a and the center distance between the latent image 2b' and the alignment mark 11b become ΔX' and ΔX', respectively.

Then, the illuminating light 1' from the TTL type alignment optical system is projected to the latent images on the wafer W through the window 20 and an image signal IP corresponding to a scanning line SL resulting from an X-direction scanning of a photosensitive surface 27a by the image pickup means 27 is generated.

Figure 13:
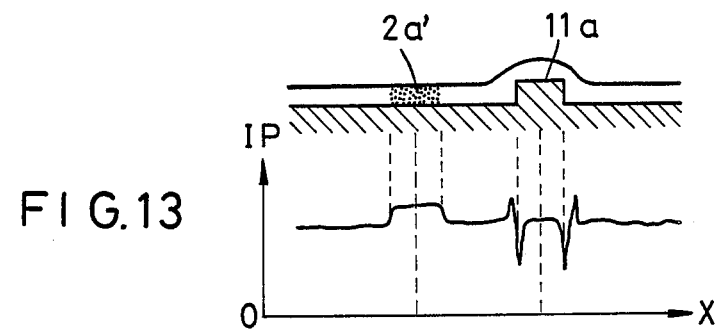

FIG. 13 is a waveform diagram of the image signal produced as a result of the illumination by the illuminating light 1'. As shown in FIG. 13, there is a difference in exposure time between the portion including the latent image 2a' and the surrounding portion and the image signal IP differs in waveform between these portions, thus making it possible to easily detect the position of the latent image 2a'. Also, if the edges of the alignment marks 11a have a large fall, the regular reflected light from the photoresist corresponding to the edges is not projected to the image pickup means 27 so that the level of the image signal IP decreases in its portion corresponding to the edges and its position is detected easily. If the edges of the alignment mark 11a have a small fall, the difference in thickness between the photoresist layer corresponding to the alignment mark 11a and the photoresist layer corresponding to the surrounding portion becomes the difference in level between the portions in the image signal IP (the difference between the light and dark portions) and this permits detection of the position of the alignment mark 11a.

Then, where an image signal IP is produced by projecting onto the wafer W the illuminating light 1' of a wavelength capable of sensitizing the photoresist, the illumination by the illuminating light 1' changes the absorptance of the photoresist on the alignment mark which has not been sensitized by the projection of the exposure light 1 and this in turn slightly varies the waveform of the portion of the image signal IP corresponding to the mark 11a; thus, if the image signal IP is obtained in a very short period of time, there is the danger that the detection of the position of the alignment mark 11a will be inaccurate. Thus, while it is better to obtain the image signal IP after the sensitization of the photoresist has stabilized, this means that the unexposed portions around the latent image 2a' and the alignment mark 11a are sensitized unnecessarily and the image signal IP loses its contrast.

Figure 14A:
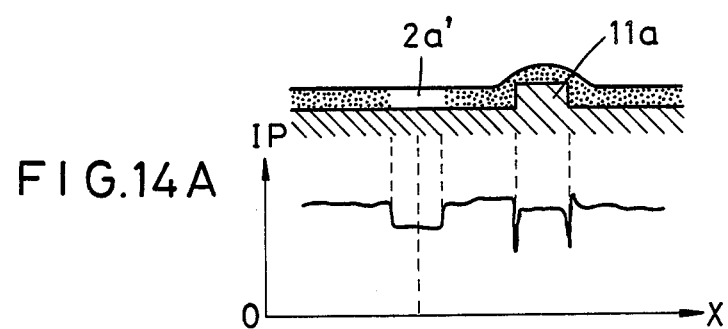
Figure 14B:
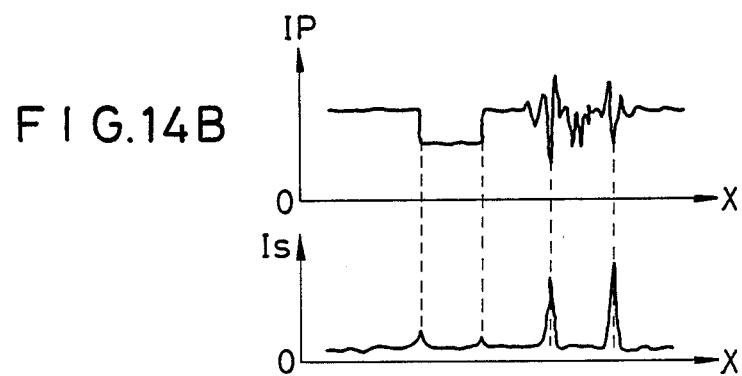

As a result, the present embodiment is so designed that the latent image 2a' is formed without exposure by the exposure light 1 as shown in FIG. 14A, that is, the latent image 2a' is formed by exposing the photoresist layer including the photoresist on the alignment mark 11a but excluding the portion where the latent image 2a' is to be formed and then the illuminating light 1' is projected. However, this is effective only in cases where the observation is made by means of light having a wavelength to which the photoresist is sensitive and either of the two methods may be used in cases where the latent images are detected with light which cannot sensitize the photoresist. Also, even in cases where the photoresist layer excluding the portion of the latent image 2a' is exposed to the exposure light 1 as shown in FIG. 14A, there is the danger of deteriorating the signal-to-raise ratio (S/N) of the image signal IP due to the effect of an interference caused by any variation in the wavelength of the illuminating light 1', the thickness of the photoresist layer or the like, the refractive index of the photoresist or the like. While, with the method of making the observation with the regular reflected light, as shown in FIG. 14B, the contrast of the image signal IP corresponding to the latent image 2a' is dependent on the absorptance (or the reflectance) of the photoresist with respect to the wavelength of the illuminating light 1' and thus its waveform is relatively simple, there is the danger of deteriorating the S/N of the image signal IP in the portion corresponding to the mark 11a due to the effect of an interference fringe. Also, where the diffracted or scattered light due to the scanning by the laser beam is detected as shown in FIG. 1, there is the possibility that the S/N of the photoelectric signal $I_s$ is improved in the portion corresponding to the stepped portions of the alignment mark 11a and the S/N of the photoelectric signal $I_s$ corresponding to the portion of the latent image 2a' is deteriorated. As a result, where an apparatus comprising both of an alignment optical system as shown in FIG. 1 and an alignment optical system as shown in FIG. 9 is used, it is possible to improve the detection accuracy of the latent image 2a' and the alignment mark 11a by detecting the latent image 2a' from the regular reflected light of the light l' capable of sensitizing the photoresist layer and detecting the alignment mark 11a from the scattered or diffracted light of another light incapable of sensitizing the photoresist layer.

On the basis of the image signal IP or the photoelectric signal $I_s$ shown in FIGS. 13, 14A or 14B and obtained as described above, an X-direction registration diversion between the reticle R' and the wafer W is determined by the use of the same method as used with the apparatus shown in FIG. 1. Also, a Y-direction registration diversion between the reticle R' and the wafer W can be detected in the like manner and will not be described.

Note that where a wafer for producing the real devices is used, the latent images 2a', 2b', 3a' and 3b' are formed on that area where the real element (chip) is not formed, that is, on the street lines. On the other hand, where a special wafer such as a bare silicon wafer without any pattern is used for the determination of a magnification error of the projection lens 7 or where a test wafer is used for the determination of a registration diversion between the reticle (R') and the wafer W, latent images 2a', 2b', 3a' and 3b' may be formed without blocking the light by the reticle blinds 4a and 4b. Also, in the apparatus shown in FIG. 9, the TTL type alignment optical system may be a dark-field optical system.

Also, since the reduction projection exposure apparatus shown in FIGS. 1 and 9 are each provided with the alignment optical system of the TTL type, the apparatus may be provided with a so-called self-checking function whereby during the operation of the apparatus, such as during the exposure of the wafer W, the detection of a projection lens magnification error and the detection of a reticle-wafer registration diversion are effected at intervals of a predetermined time and the errors are corrected in an unattended manner.

Further, the diversion detecting method according to the invention may be used in any other applications where the latent image of a pattern exposed by an X-ray exposure method is detected, the characteristics of the projection optical system ( the electron lens) of an electron exposure apparatus are examined and so on.

EFFECTS OF THE INVENTION

As described hereinabove, in accordance with the present invention, by virtue of the fact that relative diversions between first patterns on a substrate to be exposed and second patterns formed as latent images can be detected, any alignment error with respect to a mask can be detected without developing the substrate to be exposed. Thus, there are effects that where the circuit pattern on a mask or the like is to be brought into registration with the chip on a wafer and exposed by the use of an exposure apparatus, any correction required for a precise alignment can be effected immediately before the registration exposure and that the production of rejects due to misregistrations can be decreased considerably.

We claim:

1. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, an exposure energy beam onto said substrate to be exposed through said mask to form on said photosensitive layer a latent image of said second mark means;
   supplying a radiation beam onto said photosensitive layer;
   photoelectrically detecting said latent image and said first mark means without development of said photosensitive layer; and
   detecting the positional relation between said first mark means and said latent image to determine said diversion.

2. A method for detecting a diversion in the registration of a substrate and a mask in an apparatus for aligning said substrate with said mask, said substrate having a first mark means and said mask having a second mark means formed thereon to have a predetermined positional relation with said first mark means when said substrate and said mask are brought into registration with each other, said method comprising the steps of:
   forming a photosensitive layer on said substrate so that said first mark means is covered with said photosensitive layer;
   projecting, after said registration, an exposure energy beam onto said substrate to be exposed through said mask to form of said photosensitive layer a latent image of said second mark means;
   supplying a radiation beam onto said photosensitive layer;
   photoelectrically detecting said latent image on the basis of a regular reflection of said radiation beam and said first mark means on a basis of a scattering of said radiation beam; and
   detecting the positional relation between said first mark means and said latent image to determine said diversion.

3. The method according to claim 2, wherein said second mark means is projected onto said substrate by a projection optical system provided between said mask and said substrate, end said radiation beam is supplied onto said photosensitive layer through said projection optical system.

4. The method according to claim 3, wherein said radiation beam forms a beam spot scanning along a scanning line on a surface of said substrate, and said positional relation is detected on the basis of a variation of said regular reflection, said scattering and a scanning position of said beam spot.

5. The method according to claim 4, wherein said exposure energy beam has a first wavelength effective in sensitizing said photosensitive layer and said radiation beam has a second wavelength which does not sensitize said photosensitive layer.

6. The method according to claim 4, wherein said exposure energy beam and said radiation beam each have a wavelength effective in sensitizing said photosensitive layer.

7. The method according to claim 2, further comprising the step of correcting said registration on the basis of said detected positional relation.

8. The method according to claim 2, wherein said latent image of said second mark means is formed near said first mark means of said substrate.

9. A method for detecting a diversion in the registration of a substrate and a mask in an apparatus for aligning said substrate and said mask, said substrate having a first mark means and said mask having a second mark means formed thereon to have a predetermined positional relation with said first mark means when said substrate and said mask are brought into registration with each other, said method comprising the steps of:
forming a photosensitive layer on said substrate so that said first mark means is covered with said photosensitive layer;
projecting, after said registration, an exposure energy beam onto said substrate to be exposed through said mask to form on said photosensitive layer a latent image of said second mark means;
supplying a spot of a radiation beam scanning along a scanning line on a surface of said substrate; and
detecting the positional relation between said first mark means and said latent image on the basis of optical information from said surface and a scanning position of said spot.

10. The method according to claim 9, further comprising the step of correcting said registration on the basis of said detected positional relation.

11. The method according to claim 9, further comprising the step of photoelectrically detecting a regular reflection of said radiation beam from said surface of said substrate, wherein said positional relation is detected on the basis of a variation of said regular reflection and said scanning position of said spot.

12. The method according to claim 9, further comprising the step of photoelectrically detecting a regular reflection and a scattering of said radiation beam from said surface of said substrate respectively, wherein said positional relation is detected on the basis of a variation of said regular reflection, said scattering and said scanning position of said spot.

13. The method according to claim 9, wherein said second mark means is projected onto said substrate by a projection optical system provided between said mask and said substrate, and said radiation beam is supplied onto said photosensitive layer through said projection optical system.

14. The method according to claim 13, wherein said exposure energy beam has a first wavelength effective in sensitizing said photosensitive layer and said radiation beam has a second wavelength which does not sensitize said photosensitive layer.

15. The method according to claim 13, wherein said exposure energy beam and said radiation beam each have a wavelength effective in sensitizing said photosensitive layer.

16. The method according to claim 9, wherein said latent image is formed near said first mark means of said substrate.

17. A method for detecting a diversion in the registration of a substrate and a mask in an apparatus for aligning said substrate with said mask, said substrate having a first alignment mark and said mask having a second alignment mark formed thereon to have a predetermined positional relation with said first alignment mark when said substrate and said mask are brought into registration with each other, said method comprising the steps of:
forming a photosensitive layer on said substrate so that said first alignment mark is covered with said photosensitive layer;
positioning said substrate and said mask at a determined positional relation with each other;
projecting an exposure energy beam effective in sensitizing said photosensitive layer onto said substrate to be exposed through said mask to form on said photosensitive layer a latent image of said alignment mark so that said photosensitive layer covering a portion corresponding to said first alignment mark is sensitized by said exposure energy beam;
supplying a radiation beam effective in sensitizing said photosensitive layer onto a surface of said substrate; and
detecting the positional relation between said first alignment mark and said latent image on the basis of optical information from said surface.

18. The method according to claim 17, further comprising the step of correcting said registration on the basis of said detected positional relation.

19. The method according to claim 17, further comprising the step of photoelectrically detecting a regular reflection of said radiation beam from said surface of said substrate, wherein said positional relation is detected on the basis of a variation of said regular reflection.

20. The method according to claim 17, further comprising the step of imaging said surface of said substrate on a imaging plane, wherein said positional relation is detected on the basis of an image formed on said imaging plane.

* * * * *

Notice of Adverse Decision in Interference

In Interference No. 102,276, involving Patent No. 4,741,622, K. Suwa and M. Murakami, METHOD AND APPARATUS FOR DETECTING DIVERSION, final judgement adverse to the patentees was rendered Oct. 23, 1990, as to claims 1-20.

*(Official Gazette Nov. 19, 1991)*